United States Patent [19]

Jeon

[11] Patent Number: 5,351,217
[45] Date of Patent: Sep. 27, 1994

[54] WORD LINE VOLTAGE SUPPLY CIRCUIT

[75] Inventor: Yong W. Jeon, Seoul, Rep. of Korea

[73] Assignee: Goldstar Electron Co., Ltd., Cheongju, Rep. of Korea

[21] Appl. No.: 996,304

[22] Filed: Dec. 23, 1992

[30] Foreign Application Priority Data

Dec. 24, 1991 [KR] Rep. of Korea ............. 91-23687

[51] Int. Cl.$^5$ .......................................... G11C 7/00
[52] U.S. Cl. .................... 365/230.06; 365/230.08; 365/230.01; 307/449; 307/451
[58] Field of Search ............. 365/189.09, 189.11, 365/226, 230.06, 230.08, 203, 230.01; 307/449, 451

[56] References Cited

U.S. PATENT DOCUMENTS

| | | | |
|---|---|---|---|
| 4,798,977 | 1/1989 | Sakui et al. | 307/446 |
| 4,807,190 | 2/1989 | Ishii et al. | 365/189.09 |
| 4,820,941 | 4/1989 | Dolby et al. | 307/449 |
| 4,843,261 | 6/1989 | Chappell et al. | 307/449 |
| 4,884,240 | 11/1989 | Dennison et al. | 365/189.09 |
| 4,897,820 | 1/1990 | Shiomi et al. | 365/230.08 |
| 4,953,133 | 8/1990 | Kashimura | 365/230.06 |
| 5,056,062 | 10/1991 | Kuwabara et al. | 365/189.11 |
| 5,103,113 | 4/1992 | Inui et al. | 307/270 |

Primary Examiner—Eugene R. LaRoche
Assistant Examiner—Son Mai
Attorney, Agent, or Firm—Alan R. Loudermilk

[57] ABSTRACT

A word line supply circuit reducing the capacitance operating as a load at a time of enabling a word line in a semiconductor memory, resulting in the internal voltage supply being more stable. A word line voltage supply circuit is provided for directly driving the word line by the internal voltage supply Vpp and whereby pulling up the word line to the Vpp level. A row decoder 100 receives a voltage from a Vcc power supply and receives an address signal and outputs an RDout signal that selects a predetermined number of a word line group. A reset level converter 200 receives a voltage from a Vpp power supply which is a higher voltage level than Vcc, and receives the RDout signal and a RESET signal for resetting the word line and outputs a RESET signal. A word line driver controller 300 receives a voltage from the Vpp power supply and receives the RDout signal, RESET signal and a predecoder signal as inputs and outputs a WLEN signal, which is a word line control signal. A word line driver 400 receives a voltage from the Vpp power supply and applies the Vpp voltage to one word line by the WLEN signal.

13 Claims, 4 Drawing Sheets

WORD LINE VOLTAGE SUPPLY CIRCUIT

BACKGROUND OF THE INVENTION

1. Field of the Invention

The present invention relates to a word line voltage supply circuit, and more particularly to a word line voltage supply circuit configuration directed to reduced power consumption when operating a word line of a DRAM.

2. Description of the Prior Art

A conventional word line voltage supply circuit, such as is shown in FIG. 1, typically comprises row decoder array 20, level converter array 30 for converting the output of each row decoder from voltage level Vcc to voltage level Vpp, word line drivers 40 coupled to row decoders of row decoder array 20, and secondary row decoders 10 for selecting one of word line drivers 40. Secondary row decoders 10 convert signals from voltage level Vcc to voltage level Vpp, which are supplied to word line drivers 40.

Word line drivers 40 receive a voltage level of Vpp from secondary row decoders 10 and drives word lines (WLi) in accordance with the signals of row decoders 20 being of the voltage level Vpp through level converters 30.

The operation of a conventional circuit as described above and illustrated in FIG. 1 will now be discussed. When a memory element is in a standby state, operation of the circuit is conducted so as to maintain row decoder pre-charge signal PC (herein, an underscore in the text is intended to refer to a "barred" or complemented signal in the drawings) at a "low" level, address signals RAi (RA0 to RA3, RAn0 to RAn3) also at "low" levels, level converter outputs RDout1 to RDoutn at a "high" level of voltage Vpp, and the outputs of secondary row decoder 10 (WLD0 to WLD3) at a "low" level.

When the memory element goes to an activated state, that is signal PC becomes a "high" level of voltage Vcc as illustrated in FIG. 2, PMOS transistor Q8 turns off, and PMOS transistor Q9 maintains node C at a "high" level via inverter 22.

When address signals RAi (RA0 to RA3) all become a "high" level of voltage Vcc, transistors Q10, Q11, Q12 and Q13 are turned on, node C becomes a "low" level, and node D becomes a "high" level of voltage Vcc, then transistor Q15 turns off, transistor Q17 turns on, and level converter output RDout1 is changed from a "high" level of voltage Vpp to a "low" level, transistor Q14 turns on, and node E goes to a "high" level of voltage Vpp, and transistor Q16 turns off. Level converter output RDout1 becomes a "low" level, and transistors Q19, Q22, Q25 and Q28 are turned off.

When address signals RF go from a "high" level of voltage Vcc to a "low" level at almost the same timing as address signals RAi as shown in FIG. 2, transistor Q2 turns off, transistor Q3 turns on whereby node B goes from a "high" level of voltage Vcc to a "low" level, transistor Q1 turns on whereby node A goes to a "high" level of voltage Vpp, and thereby transistor Q4 turns off.

With node B at a "low" level, transistor Q5 turns on, transistor Q7 turns off, and secondary row decoder output WLD0 becomes a "high" level of voltage Vpp. When the gate of transistor Q18 becomes a "low" level, whereby transistor Q18 turns on, and secondary row decoder output WLD0 becomes a "high" level of voltage Vpp, word line WL0 also becomes a "high" level of voltage Vpp and thereby becomes selected.

Since one row decoder 20 is coupled to four word lines WL0, WL1, WL2 and WL3 when level converter output RDout1 becomes "low" with NMOS transistors Q19, Q22, Q25 and Q28 turned off, the four word lines selected by one row decoder 20 are connected to ground. Given that the word lines can have a threshold voltage Vtp of an NMOS transistor reached by a noise signal, clamp transistors Q20, Q23, Q26 and Q29 are connected to address signals RF0, RF1, RF2 and RF3. Given that address signals RF1, RF2 and RF3 for word lines that are not selected are "high" level, clamp transistors Q23, Q26 and Q29 are turned on, whereby the word lines WL1, WL2 and WL3 are maintained at ground potential. Level converter output RDoutn maintains a "high" voltage of Vpp at row decoders which are not selected, and thereby, for example, if secondary row decoder output WLD0 goes to a "high" voltage level of Vpp, PMOS transistor Q18 does not turn on.

When the memory element is returned again to a standby state, address signals RAi (RA0 to RA3) become "low" level and address signal RF0 becomes "high" level, and thereby secondary row decoder output WLD0 goes from a "high" level of voltage Vpp to a "low" level. Given that word line WL0 cannot be pulled to a "low" level by PMOS transistor Q18, clamp transistor Q20 is turned on, and a "low" level is applied as signal PC, whereby level converter output RDout1 goes to a "high" level of voltage Vpp, and word line WL0 is pulled to a "low" level.

In word line driver circuit 40, the gate and source signals of transistor Q18, that is RDoutn and WLDi, are signals of voltage level Vpp of an internal voltage supply, and gate signal RFi of clamp transistor Q20 is controlled by a signal of voltage level Vcc.

When assuming that the junction capacitance of a transistor is $C_D$, and the number of transistors connected to the word line is n, the sum of the junction capacitances becomes $nC_D$. Assuming that the capacitance of the word line itself is Cw1, and that the capacitance of the secondary row decoder output line is Cm (which is a capacitance of metal wire), capacitance CWLDi of secondary row decoder output WLDi line present when the voltage Vpp is applied is $(nC_D+Cw1+Cm)$.

Since the source node of word line driver 40 is commonly connected to the high voltage level, that is, to secondary row decoder outputs WLDi (i=0, 1, 2, 3) of a voltage level Vpp in prior art devices in order to enable the word line, and given that the sum of the capacitances connected to the word lines $CWLDi=(nCD+Cm+Cw1)$ becomes a load applied to the internal voltage supply (charge pump high voltage supply), the level of the internal voltage supply can become greatly reduced. As a result, the internal voltage level may become unstable, and, while restoring this internal voltage level, a significant amount of power may be consumed.

SUMMARY OF THE INVENTION

Accordingly, the present invention is to overcome disadvantages of prior art circuits. The present invention provides a word line voltage supply circuit with a decreased capacitance operating as a load at the time of enabling the word line, with the result that the power consumption of the internal voltage supply is decreased, and the voltage level of the internal voltage supply is made to be more stable.

The present invention provides a word line voltage supply circuit for directly driving the word line by the internal voltage supply Vpp and pulling up the word line to the voltage Vpp, and comprises: row decoder 100 coupled to a voltage Vcc power supply and receiving address signals and outputting signal RDout of a voltage on the order of voltage Vcc that selects a predetermined number of a word line group; reset level converter 200 coupled to a voltage Vpp power supply, with voltage Vpp being a higher level than voltage Vcc, and receiving signal RDout and a RESET signal for resetting the word line and outputting signal $\overline{\text{RESET}}$ of a voltage on the order of voltage Vpp; word line driver controller 300 coupled to a voltage Vpp power supply and receiving signal RDout, signal $\overline{\text{RESET}}$ and pre-decoder signals as inputs and outputting a $\overline{\text{WLEN}}$ signal which is a word line control signal; and word line driver 400 coupled to a voltage Vpp power supply and applying voltage Vpp to a word line by the word line control signal WLEN of word line driver controller 300.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE PREFERRED EMBODIMENT

Hereinafter, a preferred embodiment of the present invention will be described in more detail with reference to the accompanying drawings of FIG. 3 and FIG. 4.

Figure 1:
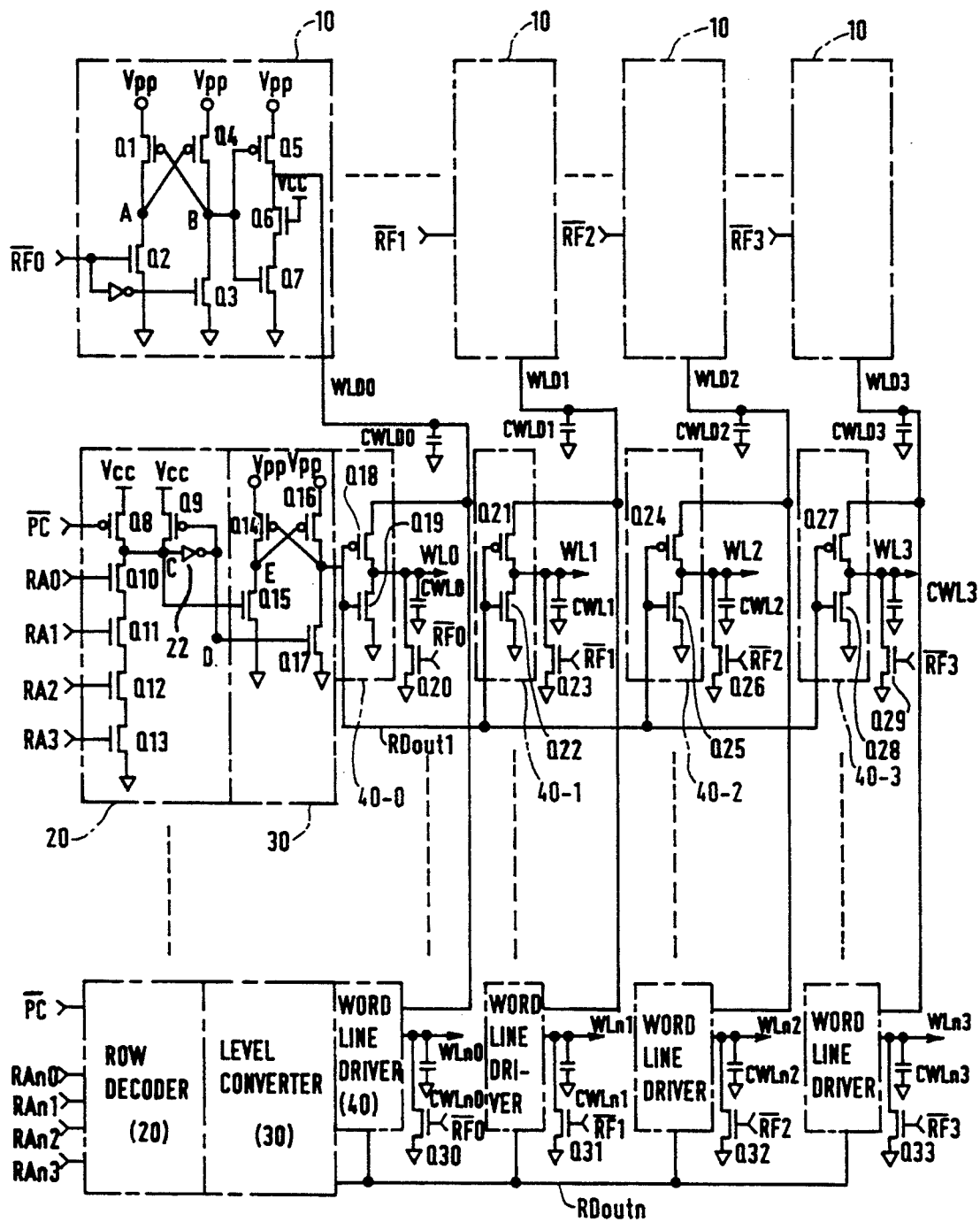
FIG. 1 is a diagram illustrating a conventional word line voltage supply circuit.
Figure 2:
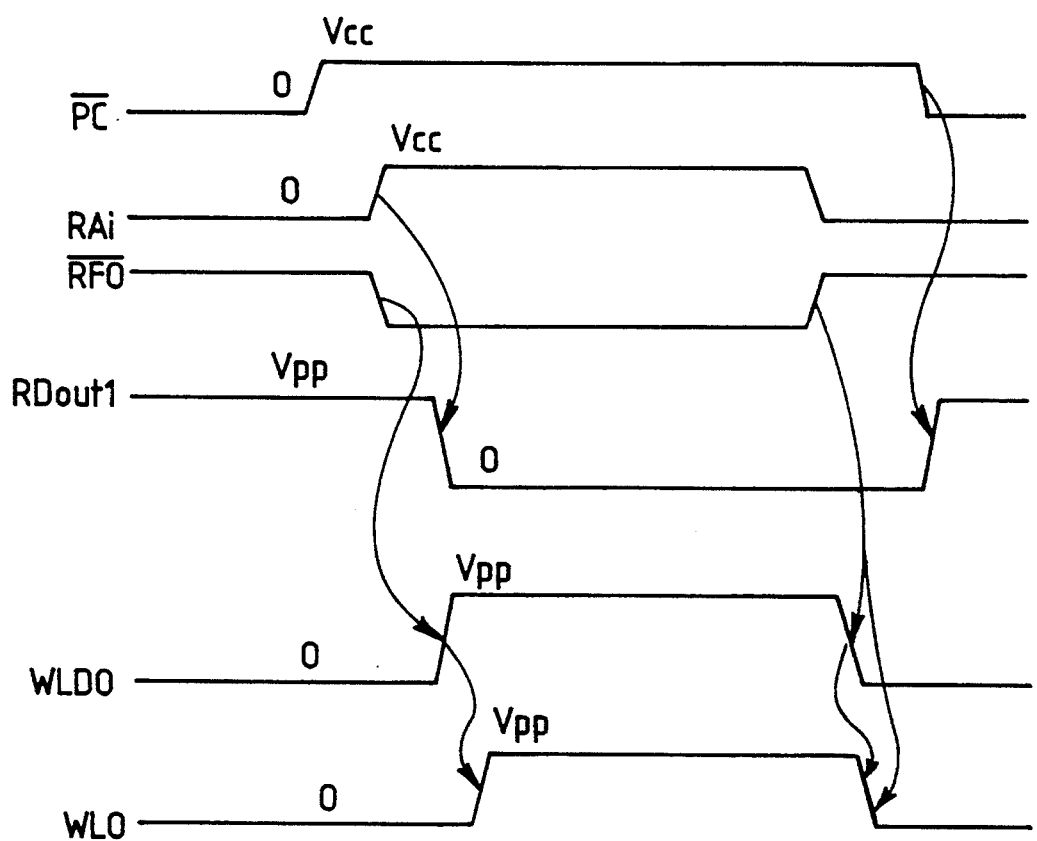
FIG. 2 is a waveform diagram illustrating the operation of the conventional word line voltage supply circuit.
Figure 3:
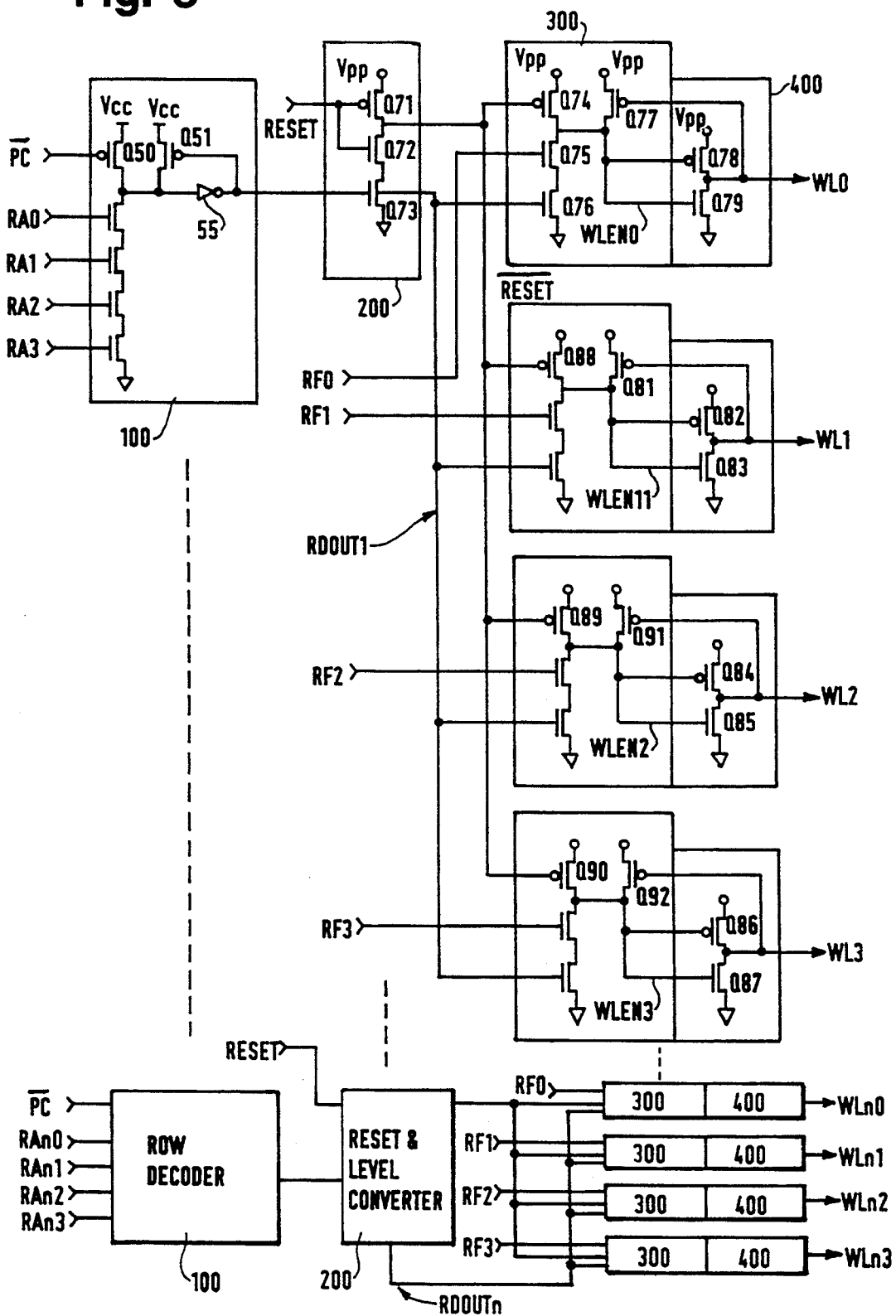
FIG. 3 is a diagram illustrating a word line voltage supply circuit in accordance with the present invention.

A word line voltage supply circuit in accordance with the present invention is constructed, as shown in FIG. 3, to directly drive the word lines by an internal high voltage supply Vpp so as to pull up the word line voltage up to the voltage level Vpp, and comprises:

row decoder 100 coupled to a voltage Vcc power supply and receiving address signals and outputting level converter output signal RDout of a voltage on the order of the Vcc voltage level that selects a predetermined number of a word line group;

reset level converter 200 coupled to a voltage Vpp power supply, with voltage Vpp being a higher level than voltage Vcc, and receiving signal RDout and a RESET signal for resetting the word line and outputting signal $\overline{\text{RESET}}$ of a voltage on the order of voltage Vpp;

word line driver controller 300 coupled to a voltage Vpp power supply and receiving signal RDout, signal $\overline{\text{RESET}}$ and pre-decoder signals RF0, RF1, RF2 and RF3 as inputs and outputting $\overline{\text{WLEN}}$ signals $\overline{\text{WLEN0}}$, $\overline{\text{WLEN1}}$, $\overline{\text{WLEN2}}$ and $\overline{\text{WLEN3}}$, which are word line control signals; and word line driver 400 coupled to a voltage Vpp power supply and applying the voltage Vpp to a word line by word line control signal WLEN of the word line driver controller.

Row decoder 100 is driven by a core power supply Vcc which drives a bit line sense amplifier and a column decoder; and reset level converter 200, word line driver controller 300 and word line driver 400 are driven by an internal voltage power supply of a predetermined voltage level Vpp, which is higher than the Vcc voltage level of the core power supply.

Figure 4:
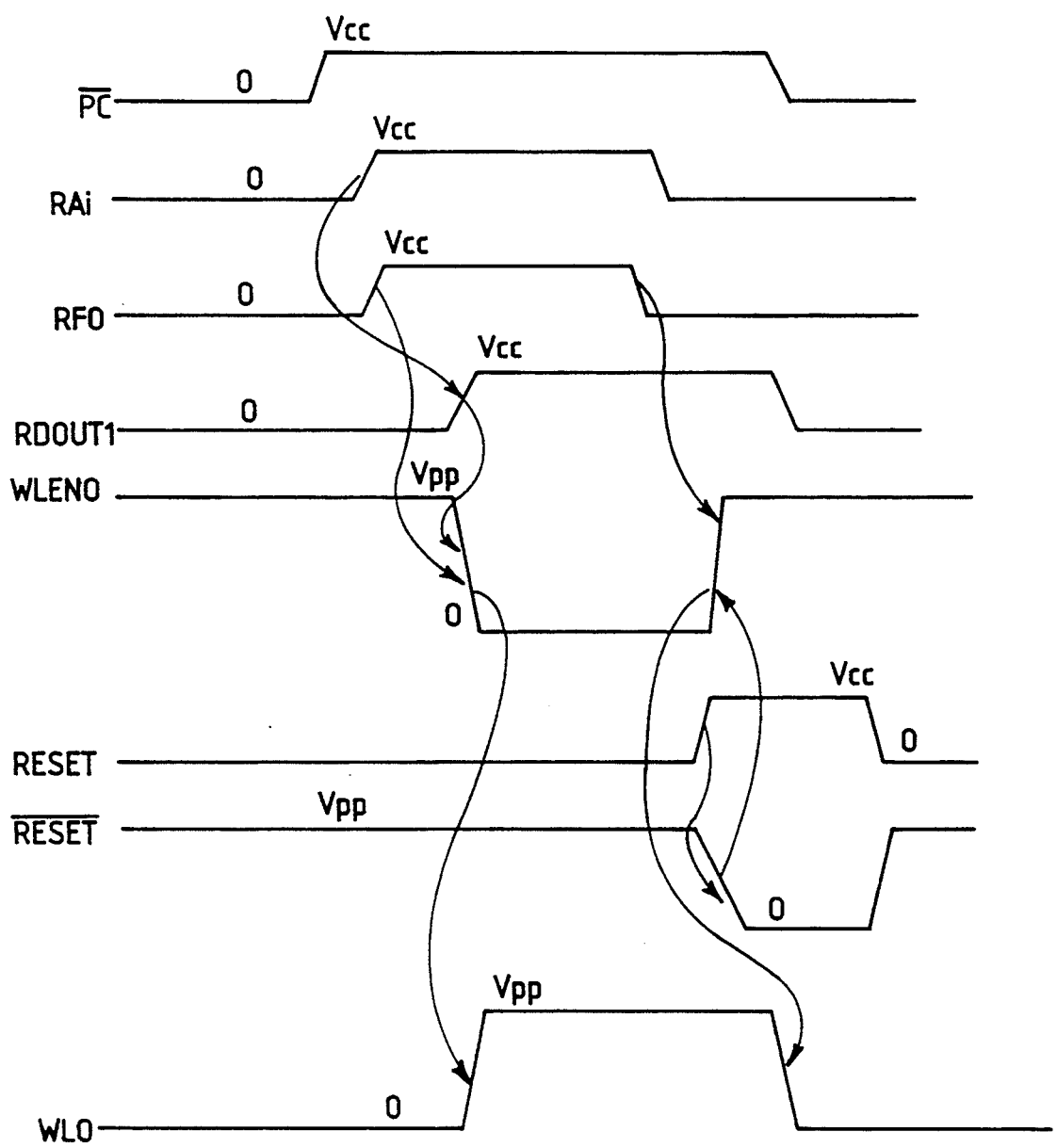
FIG. 4 is a waveform diagram illustrating the operation of a word line voltage supply circuit in accordance with the present invention.

When a memory element is in a standby state, as illustrated in FIG. 4, row decoder pre-charge signal $\overline{\text{PC}}$ maintains a "low" level state, signal RESET, which causes the word line to be off, also is in a "low" level state, pre-decoder signals RAi (RA0 to RA3, RAn0 to RAn3) and RFi (RF0 to RF3) also are in "low" level states.

When the memory element is to be put into an activated state, firstly signal $\overline{\text{PC}}$ becomes "high" level, transistor Q50 turns off, and a "low" level that passes through invertor 55 will result in output RDouti (i=1,2, ... n) of row decoder 100 becoming "high" level. The "high" level state of signal RDouti is latched and maintained by transistor Q51. In this state, when one row decoder among row decoder array 100 is selected by pre-decoder signals RA0 to RA3, RAn0 to RAn3, output RDouti of row decoder array 100 goes from a "low" level to a "high" level. At this moment, signal RESET is maintaining a "low" level state.

Since the present invention as illustrated in FIG. 3 is constructed so that one row decoder 100 selects four word lines, pre-decoder signals RF0 to RF3 for selecting one of these four word lines become required, and when one of them, for instance RF0, becomes "high" level, NMOS transistor Q75 turns on. Given that NMOS transistor Q76 turns on (has a "high" level signal applied to its gate) while the row decoder connected with this transistor is selected, node $\overline{\text{WLEN0}}$ goes from a "high" voltage level of Vpp to a "low" level, and transistor Q78 of word line driver 400 is turned on, and transistor Q79 is turned off, and thereby word line WL0 is raised to voltage level Vpp.

Since pre-decoder signals RF1 to RF3 maintain a "low" level state, PMOS transistors Q82, Q84 and Q86 are turned off, and NMOS transistors Q83, Q85 and Q87 are maintained in a turned on state, word lines WL1, WL2 and WL3 are maintained in a "low" level state, and outputs RDouti (i=2,3, ... n) of the row decoders that are not selected maintain a "low" level state, and other word line driver controllers connected with the pre-decoder signals do not operate the word line driver controller 300 even if pre-decoder signal RF0 becomes "high" level.

When the memory element is to again be in a standby state, signals RA0 to RA3, RAn0 to RAn3, RF0 to RF3 all become "low" level, and when signal $\overline{\text{PC}}$ maintains a "high" level state, control signal RESET of Vcc level for causing the word line to resume an off state is input by a "one shot pulse" and NMOS transistor Q72 is turned on. Since the voltage level of the source of PMOS transistor Q71 is voltage level Vpp, which is higher than voltage level Vcc, transistor Q71 remains in a turned on state; but since transistors Q71, Q72 and Q73 are designed to be what is know as a "ratioed inverter", output $\overline{\text{RESET}}$ becomes sufficiently "low" level that it is capable of causing turn on of PMOS transistors Q74, Q88, Q89 and Q90.

When signal $\overline{\text{RESET}}$ becomes "low" level, PMOS transistor Q74 is turned on. Since NMOS transistor Q75 was previously turned off, word line control signal WLEN becomes a "high" level of voltage Vpp, PMOS transistor Q78 is turned off, NMOS transistor Q79 is turned on, and the voltage of word line WL0 is discharged and becomes in a "low" level state.

When in a standby state, PMOS transistors Q77, Q81, Q91 and Q92 are turned on by the output of word line driver 400, that is, the word line voltage, and thereby the input of word line driver 400 is maintained at a "high" level of voltage Vpp.

In accordance with the foregoing, since the capacitance component of the word line that is to be repeatedly charged and discharged by voltage Vpp is be made to be only a component of the word line itself, the power consumption of the charging and discharging to and from voltage Vpp is minimized, the voltage Vpp level may be more stably maintained, and the rise time of the word line can be decreased by connecting the voltage Vpp directly to the word line driver.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A word line voltage supply circuit of a memory device comprising:
   a row decoder receiving a voltage Vcc from a first power supply and receiving address signals and outputting an RDout signal of a voltage on the order of voltage Vcc, wherein the RDout signal selects a predetermined number of word lines of a word line group;
   a reset level converter receiving a voltage Vpp from a second power supply, wherein the voltage Vpp is a higher voltage level than voltage Vcc, the reset level converter also receiving the RDout signal and a RESET signal for resetting the word line and outputting a $\overline{\text{RESET}}$ signal of a voltage on the order of Vpp;
   a word line driver controller receiving a voltage on the order of Vpp from the second power supply and receiving the RDout signal, $\overline{\text{RESET}}$ signal and a pre-decoder signal as inputs and outputting a word line control signal WLEN; and
   a word line driver receiving a voltage on the order of Vpp from the second power supply and applying a voltage on the order of Vpp to a selected word line in response to the WLEN signal.

2. The word line voltage supply circuit as claimed in claim 1, wherein the word line driver controller includes a PMOS transistor having a gate connected to the word line, a source connected to the second power supply, and a drain connected to an input of the word line driver;
   wherein the selected word line has a voltage on the order of Vpp applied thereto when the memory device is activated, and wherein word lines that are not selected are maintained at ground level when the memory device is activated, and wherein all word lines are maintained at ground level when the memory device is not activated.

3. The word line voltage supply circuit as claimed in claim 2, wherein the word line driver controller is constituted to be grounded through a series circuit consisting of a PMOS transistor having a gate coupled to receive a $\overline{\text{RESET}}$ signal, an NMOS transistor having a gate coupled to receive the RDout signal, and an NMOS transistor having a gate coupled to receive a pre-decoder signal;
   wherein the word line driver controller operates in response to the RDout signal and the pre-decoder signal at a time when the word line driver controller outputs a word line control signal WLEN, wherein the word line driver controller causes the resetting of the word line in response to the $\overline{\text{RESET}}$ signal.

4. The word line voltage supply circuit as claimed in claim 1, wherein the word line driver comprises an inverter.

5. The word line voltage supply circuit as claimed in claim 2, wherein the word line driver comprises an inverter.

6. The word line voltage supply circuit as claimed in claim 3, wherein the word line driver comprises an inverter.

7. The word line voltage supply circuit as claimed in claim 1, wherein the reset level converter is constituted to have a PMOS transistor connected in series with first and second NMOS transistors, the first NMOS transistor being connected in series with the PMOS transistor and the second NMOS transistor being connected in series with the first NMOS transistor, wherein the source of the PMOS transistor is connected to the second power supply, the gate of the PMOS transistor and the gate of the first NMOS transistor are connected together and coupled to receive the RESET signal, and the gate of the second NMOS transistor is coupled to receive the RDout signal;
   wherein, in response to receipt of the RESET signal in the form of a one shot pulse, the PMOS and NMOS transistors operate as a ratioed invertor, wherein the $\overline{\text{RESET}}$ signal is output as a low level signal.

8. The word line voltage supply circuit as claimed in claim 2, wherein the reset level converter is constituted to have a PMOS transistor connected in series with first and second NMOS transistors, the first NMOS transistor being connected in series with the PMOS transistor and the second NMOS transistor being connected in series with the first NMOS transistor, wherein the source of the PMOS transistor is connected to the second power supply, the gate of the PMOS transistor and the gate of the first NMOS transistor are connected together and coupled to receive the RESET signal, and the gate of the second NMOS transistor is coupled to receive the RDout signal;
   wherein, in response to receipt of the RESET signal in the form of a one shot pulse, the PMOS and NMOS transistors operate as a ratioed invertor, wherein the $\overline{\text{RESET}}$ signal is output as a low level signal.

9. The word line voltage supply circuit as claimed in claim 3, wherein the reset level converter is constituted to have a PMOS transistor connected in series with first and second NMOS transistors, the first NMOS transistor being connected in series with the PMOS transistor and the second NMOS transistor being connected in series with the first NMOS transistor, wherein the source of the PMOS transistor is connected to the second power supply, the gate of the PMOS transistor and the gate of the first NMOS transistor are connected together and coupled to receive the RESET signal, and the gate of the second NMOS transistor is coupled to receive the RDout signal;

wherein, in response to receipt of the RESET signal in the form of a one shot pulse, the PMOS and NMOS transistors operate as a ratioed invertor, wherein the RESET signal is output as a low level signal.

10. A circuit for supplying a voltage to a word line in a memory device, comprising:

a row decoder coupled to a first power supply and receiving address signals, the row decoder generating a word line group select signal that selects a predetermined number of word lines of a word line group;

a circuit for resetting the word line, the reset circuit receiving a reset input signal and generating a word line reset signal;

a word line driver controller receiving a voltage from a power supply providing a higher voltage output than the first power supply, the word line driver controller being coupled to receive the word line group select signal generated by the row decoder, the word line driver controller also receiving a pre-decoder address signal, the pre-decoder address signal corresponding to a word line in the word line group, the word line driver controller generating a word line control signal in response to the word line group select signal and the pre-decoder address signal; and a word line driver circuit receiving a voltage from a power supply providing a higher voltage output than the first power supply, the word line driver supplying a voltage to a selected word line in response to the word line control signal generated by the word line driver controller.

11. The circuit of claim 10, wherein the selected word line has applied thereto a voltage greater than the voltage supplied by the first power supply when the memory device is activated, and wherein word lines that are not selected are maintained at ground level when the memory device is activated, and wherein all word lines are maintained at ground level when the memory device is not activated.

12. The circuit of claim 10, wherein the word line driver controller is coupled to receive the word line reset signal generated by the reset circuit, wherein the word line driver controller causes the resetting of the word line in response to the word line reset signal generated by the reset circuit.

13. The circuit of claim 10, wherein the reset circuit is coupled to a power supply providing a voltage greater than the voltage supplied by the first power supply, wherein the reset circuit comprises a ratioed inverter circuit, the ratioed inverter circuit generating a low voltage level word line reset signal in response to a high level reset input signal.

* * * * *